United States Patent
Maeda et al.

(10) Patent No.: US 7,443,469 B2
(45) Date of Patent: Oct. 28, 2008

(54) DISPLAY DEVICE, COLOR FILTER, AND ELECTRONIC APPARATUS

(75) Inventors: Tsuyoshi Maeda, Kai (JP); Hidekuni Moriya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 441 days.

(21) Appl. No.: 11/061,441

(22) Filed: Feb. 22, 2005

(65) Prior Publication Data

US 2005/0236950 A1  Oct. 27, 2005

(30) Foreign Application Priority Data

Apr. 26, 2004 (JP) ............... 2004-129655

(51) Int. Cl.
G09G 5/02 (2006.01)
G09G 3/32 (2006.01)
G09G 3/20 (2006.01)

(52) U.S. Cl. .................. 349/108; 349/104; 349/106; 348/790

(58) Field of Classification Search ............. None
See application file for complete search history.

(56) References Cited

U.S. PATENT DOCUMENTS

| | | | |
|---|---|---|---|
| 4,589,734 A | | 5/1986 | Needham et al. |
| 4,800,375 A | | 1/1989 | Silverstein et al. |
| 5,466,926 A | * | 11/1995 | Sasano et al. ............ 250/216 |
| 6,023,315 A | * | 2/2000 | Harrold et al. ............ 349/108 |
| 6,097,367 A | | 8/2000 | Kuriwaki et al. |
| 6,570,584 B1 | | 5/2003 | Cok et al. |
| 6,980,176 B2 | * | 12/2005 | Matsumoto et al. ............ 345/6 |

FOREIGN PATENT DOCUMENTS

| | | |
|---|---|---|
| EP | 0 367 848 A1 | 5/1990 |
| EP | 0 831 451 A2 | 3/1998 |
| JP | A-03-092888 | 4/1991 |
| JP | A-08-248410 | 9/1996 |
| JP | A-11-84365 | 3/1999 |
| JP | A-2001-306023 | 11/2001 |
| JP | A-2005-62833 | 3/2005 |
| KR | 1998-024401 A | 7/1998 |
| WO | WO-02/101644 A | 12/2002 |
| WO | WO 03/088203 A1 | 10/2003 |
| WO | WO-2004/068459 A | 8/2004 |

* cited by examiner

*Primary Examiner*—Ashok Patel
(74) *Attorney, Agent, or Firm*—Oliff & Berridge, PLC

(57) ABSTRACT

To provide a display device, a color filter, and an electronic apparatus, which can prevent the deterioration of resolution and display quality and can improve display characteristics. There is provided a display device comprising a plurality of dots in a unit pixel. The dots includes first to third dots having first to third peak wavelengths in the wavelength characteristics of emitted light, and a fourth dot having a fourth peak wavelength which is located between the first peak wavelength and the second peak wavelength, and has the fourth peak wavelength which is closer to the second peak wavelength than to the first peak wavelength, in the wavelength characteristics. The fourth dot is arranged not to be adjacent to the second dot, but is arranged to be adjacent to the first dot or the third dot.

9 Claims, 9 Drawing Sheets

FIG.2
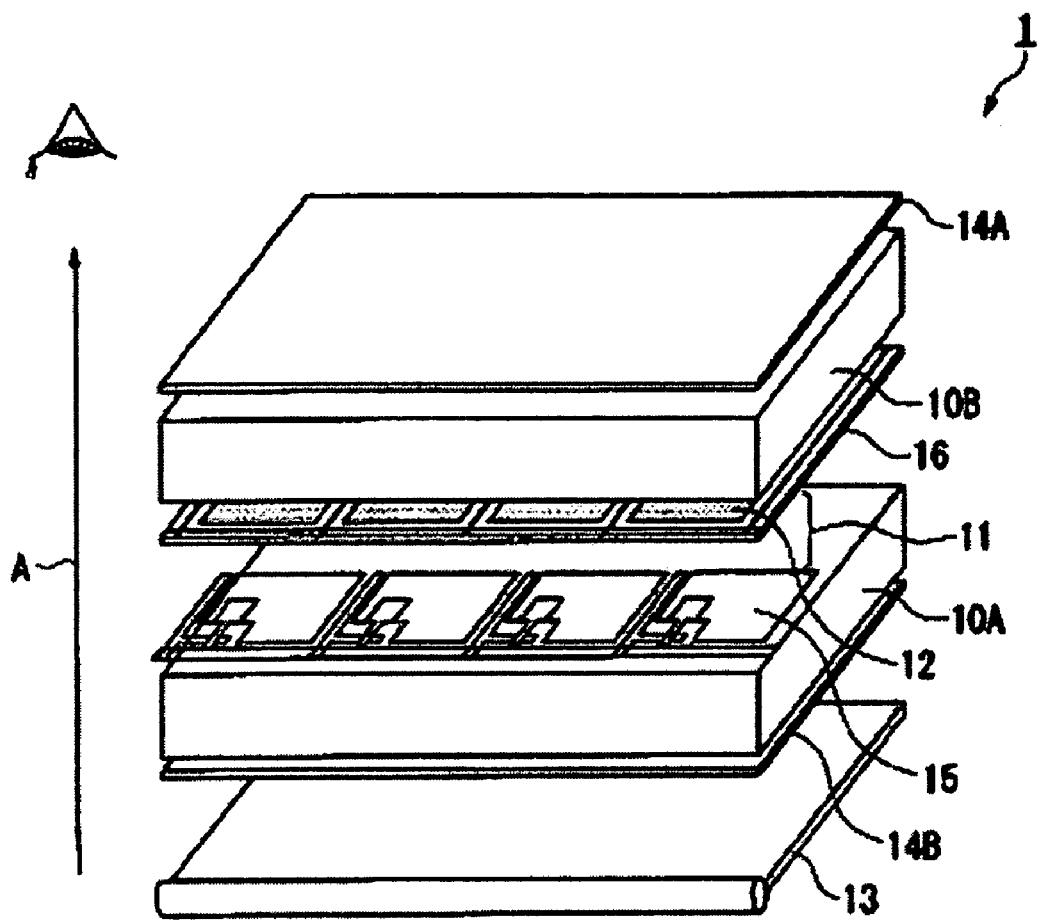
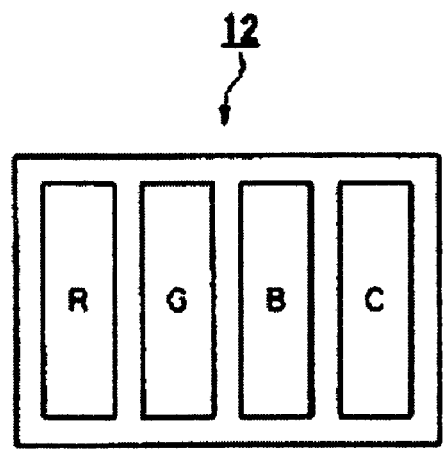
FIG.3A
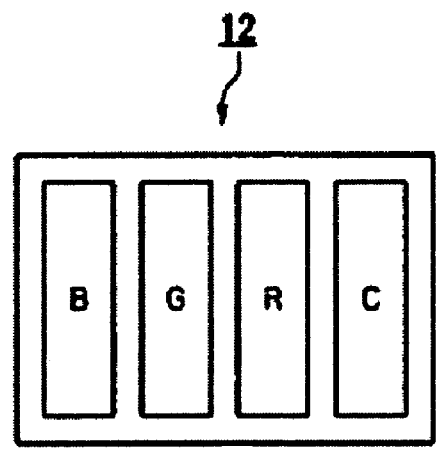
FIG.3B

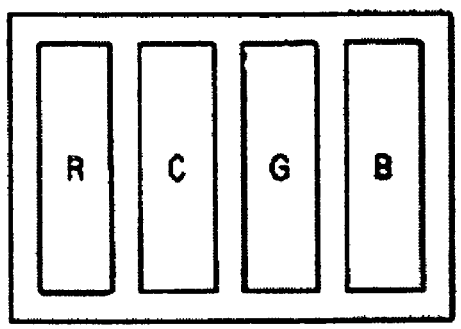
FIG.8A
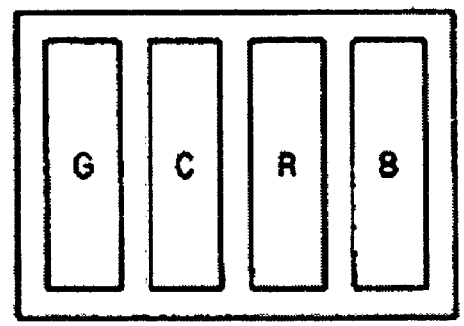
FIG.8B
FIG.9
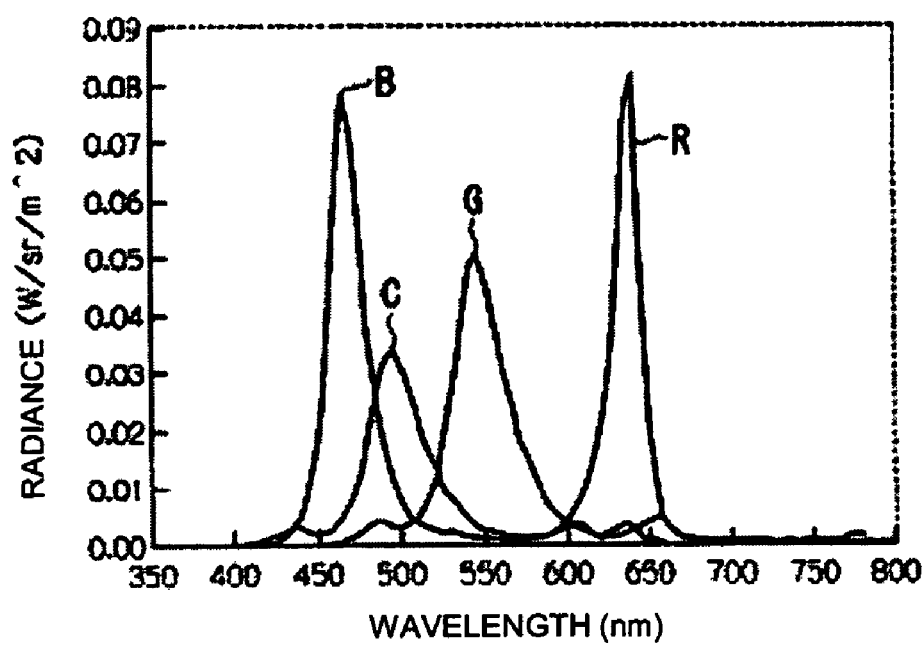

DISPLAY DEVICE, COLOR FILTER, AND ELECTRONIC APPARATUS

BACKGROUND

The present invention relates to a display device, a color filter, and an electronic apparatus.

Conventionally, various types of display devices have been proposed. For example, cathode ray tube (CRT) display devices, liquid crystal display (LCD) devices, organic electroluminescent (EL) devices (hereinafter referred to as an organic EL device), plasma display devices etc. are known. All such display devices have a construction that comprises R(red)/G(green)/B(blue) color dots in a unit pixel. In this construction, the amount of light of each color dot is varied to realize various colors and to display images.

Meanwhile, it was difficult to realize colors close to that of natural light because there is a wavelength range of color that cannot be displayed with only R/G/B in the natural world.

Thus, in recent years, display devices which can realize the color closer to that of natural light have been proposed (for example, see Patent Document 1). In this Patent Document, a pixel construction in which C (cyan) dot is further included in addition to three color (R/G/B) dots is employed. Since the cyan is a color that is defined outside of the triangular region that is formed by connecting R/G/B points on the chromaticity diagram with each other, it can realize a wide wavelength range of display color. Patent Document 1 also describes a pixel construction in which Y (yellow) or M (magenta) instead of 'C' is employed.

[Patent Document 1] Japanese Unexamined Patent Application Publication No. 2001-306023

SUMMARY

The technique described in Patent Document 1 allows a wide wavelength range of display color. However, the present inventors have confirmed that sufficient resolution and image display quality cannot be obtained with this technique. In other words, the technique allows an improvement in the representation performance of color, but does not necessarily follow an improvement in display quality.

It is an object of the present invention to provide a display device, a color filter and an electronic apparatus, which can solve the concerned problems, and can prevent the deterioration of its resolution and display quality, and can improve its display characteristics.

The present inventors have found out that, if two dots having similar wavelength characteristics are arranged to be adjacent to each other in a display device having four dots in a unit pixel, two dots having different wavelength characteristics may be recognized as the same dot in appearance, which may deteriorate the resolution of a displayed image in terms of human visibility, and further, if pixel units having such pixel constructions are arranged in stripes, stripes may be generated along a direction that the same color dots are adjacent to each other, which may deteriorate their image display quality.

Thus, the present inventors have invented the present invention having the following means based on the above conventional problems.

Specifically, the present invention provides a display device comprising a plurality of dots in a unit pixel. The dots includes first to third dots having first to third peak wavelengths in the wavelength characteristics of emitted light, and a fourth dot having a fourth peak wavelength which is located between the first peak wavelength and the second peak wavelength, and has the fourth peak wavelength which is closer to the second peak wavelength than the first peak wavelength in the wavelength characteristics. The fourth dot is arranged not to be adjacent to the second dot, but is arranged to be adjacent to the first dot or the third dot.

As thus described, the second dot and the fourth dot whose peak wavelengths are close to each other in the wavelength characteristics are arranged not to be adjacent to each other, but the fourth dot is arranged to the first dot or the third dot. Thus, it is possible to prevent the deterioration of resolution caused by the adjacent arrangement of the second dot and the fourth dot. Further, in the pixel construction with a striped arrangement, it is possible to suppress the generation of stripes caused by the adjacent arrangement of the second and the fourth dots, and to improve its image display quality.

Further, in Patent Document as earlier mentioned, the reason why the resolution or the image display quality deteriorates is because first to fourth dots are arranged without considering human visibility. In contrast, in the present invention, dots whose peak wavelengths are close to each other, that is, the dots which show almost the same color are separated from each other, and other dot is disposed between them. Thus, it is possible to display images that have improved in their resolution and image display quality in terms of human visibility.

Further, fourth dot is included in addition to the above mentioned first to third dots and the array of first to four dots are arranged as above mentioned. Thus, it is possible to realize a very wide range of color reproduction and to display images with a wide wavelength range of display color, and further it is possible to display the images that have improved in their resolution and image display quality.

Further, in the display device, the display color of one of the first dot and the second dot is blue and that of the other dot is green, the display color of the third dot is red, and the display color of the fourth dot is cyan.

Accordingly, in the case the wavelength characteristics of the peak wavelength of 'C' is closer to that of the peak wavelength of 'B' than that of the peak wavelength of 'G', a construction may be employed in which the dots are arrayed such that a dot showing 'C' and a dot showing 'B' are arranged not to be adjacent to each other, but the dot showing 'C' is arranged to be adjacent to dots showing 'G' or 'R'.

Further, in the case the wavelength characteristics of the peak wavelength of 'C' is closer to that of the peak wavelength of 'G' than that of the peak wavelength of 'B', a construction may be employed in which the dots are arrayed such that a dot showing 'C' and a dot showing 'G' are arranged not to be adjacent to each other, but the dot showing 'C' dot is arranged to be adjacent to dots showing 'B' or 'R'.

By this construction, it is possible to prevent the deterioration of resolution caused by the adjacent arrangement of a dot whose peak wavelength is close to that of the dot showing 'C'. It is also possible to suppress the generation of stripes that was a problem in the pixel construction of the stripe arrangement, thereby improving its image display quality. Moreover, dots showing four colors of RGBC are included and, other dot is properly arranged to be adjacent to the dot showing 'C'. Thus, it is possible to realize a very wide range of color reproduction and to display images with a wide wavelength range of display color close to that of natural light, and further it is possible to display images that have improved in their resolution and image display quality.

Further, in the xy chromaticity characteristics, a left or upper left region of a line segment that connects coordinates of 'B' and 'G' with each other is larger than an upper right region of a line segment that connects coordinates of 'G' and 'R' with each other and a lower right region of a line segment that connects coordinates of 'R' and 'B' with each other. Therefore, the left or upper left region is a region that has a larger capability of representing colors closer to that of natural light. Thus, a color coordinate dot which is located in the left or upper left region of the line segment that connects the coordinates of 'B' and 'G' with each other, i.e. the 'C' dot is included in a unit pixel, so that the color reproduction range in the region having such a large capability can be increased. Accordingly, it is possible to realize a wide wavelength range of display color close to that of natural light.

Moreover, the display device comprising four color dots including 'C' dot in a unit pixel can have a wider range of displayable region than a display device comprising other color dot such as 'Y' dot in a unit pixel.

Further, in the display device, the display color of one of the first dot and the second dot is green and that of the other dot is red, the display color of the third dot is blue, and the display color of the fourth dot is yellow.

Accordingly, in the case the wavelength characteristics of the peak wavelength of 'Y' is closer to that of the peak wavelength of 'R' than that of the peak wavelength of 'G', a construction may be employed in which the dots are arrayed such that a dot showing 'Y' and a dot showing 'R' are arranged not to be adjacent to each other, but the dot showing 'Y' dot is arranged to be adjacent to dots showing 'G' or 'B'.

Further, in the case the wavelength characteristics of the peak wavelength of 'Y' is closer to that of the peak wavelength of 'G' than that of the peak wavelength of 'R', a construction may be employed in which the dots are arrayed such that a dot showing 'Y' and a dot showing 'G' are arranged not to be adjacent to each other, but the dot showing 'Y' dot is arranged to be adjacent to dots showing 'R' or 'B'.

By this construction, it is possible to prevent the deterioration of resolution caused by the adjacent arrangement of a dot whose peak wavelength is close to that of the dot showing 'Y'. It is also possible to suppress the generation of stripes that was a problem in the pixel construction of the stripe arrangement, thereby improving its image display quality. Moreover, dots showing four colors of RGBY are included and, other dot is properly arranged to be adjacent to the dot showing 'Y'. Thus, it is possible to realize a very wide range of color reproduction and to display images with a wide wavelength range of display color close to that of natural light, and further it is possible to display images that have improved in their resolution and image display quality.

Further, in the display device, first to fourth dots have light-emitting elements.

Here, the light-emitting element means an element which shows a display color by its self-emission of light.

For example, the light-emitting element includes a light-emitting element in an organic EL device, a solid light-emitting element in an LED display device, a plasma element in a plasma display device, a CRT element in a CRT display device, a field emission element in a field emission display device etc. Also, since such light-emitting elements emit light with wavelength characteristics of first to fourth peak wavelengths, it is possible to realize a very wide range of color reproduction, and to display a wide wavelength range of display color close to that of natural light with self-emitting light. Moreover, since the first to fourth dots, i.e. first to fourth light-emitting elements are properly arranged as above, it is possible to display images that have improved in their resolution or image display quality.

Further, in the display device, first to fourth dots have first to fourth wavelength selecting elements, which have first to fourth peak wavelengths, respectively, in the wavelength characteristics, and a transmitted light amount controlling unit for controlling the amount of light transmitted through the wavelength selecting elements.

Here, the wavelength selecting element means an element which transmits a predetermined wavelength range of light included in white light by illuminating the wavelength selecting element with white light. Also, first to fourth wavelength selecting elements mean elements which transmit a wavelength range possessing first to fourth peak wavelengths included in white light. The wavelength selecting elements include, for example, respective colored layers which constitute a color filter. Further, the transmitted light amount controlling unit means a unit which controls the amount of incident light to transmit a predetermined amount of light. The transmitted light amount controlling unit includes, for example, a liquid crystal layer and a polarizing layer. Also, such wavelength selecting elements transmit light with the wavelength selection characteristics of first to fourth peak wavelengths, and the transmitted light amount controlling unit controls the amount of transmitted light. Thus, it is possible to realize a very wide range of color reproduction and to display a wide wavelength range of display color close to that of natural light with the transmitted light. Moreover, since first to fourth dots, i.e. first to fourth wavelength selecting elements are properly arranged as above, it is possible to display images that have improved in their resolution and image display quality.

Further, the display device comprises an illumination unit for illuminating the wavelength selecting elements with white light.

Here, the illumination unit is a unit which illuminates the wavelength selecting elements with white light. The illumination unit includes, for example, a backlight composed of a white LED and a lighting tube. Also, such illumination unit illuminates the wavelength selecting elements with white light, and the wavelength selecting elements transmit light with the wavelength selection characteristics of first to fourth peak wavelengths, and the transmitted light amount controlling unit controls the amount of transmitted light. Thus, it is possible to realize a very wide range of color reproduction and to display a wide wavelength range of display color close to that of natural light with the transmitted light. Moreover, since first to fourth dots, i.e. first to fourth wavelength selecting elements are properly arranged as above, it is possible to display images that have improved in their resolution and image display quality.

Further, the display device further comprises a reflecting portion for illuminating the wavelength selecting elements with reflected external light.

Here, the reflecting portion is a portion which reflects incident light from the exterior of a display device at the inside of the display device, and illuminates wavelength selecting elements with the reflected light. The reflecting portion includes, for example, a metallic film having a high light reflectance. Also, such reflecting portion reflects external light, and illuminates the wavelength selecting elements with the reflected light, and the wavelength selecting elements transmit light with the wavelength selection characteristics of first to fourth peak wavelengths included in the external light, and the transmitted light amount controlling unit controls the amount of transmitted light. Thus, it is possible to realize a very wide range of color reproduction, and to display a wide wavelength range of display color close to that of natural light with the reflected light. Moreover, since first to fourth dots, i.e. first to fourth wavelength selecting elements are properly arranged as above, it is possible to display images that have improved in its resolution and image display quality.

Further, the present invention provides a color filter comprising a plurality of dots in a unit pixel. The dots includes first to third dots having first to third peak wavelengths in wavelength selection characteristics, and a fourth dot having a fourth peak wavelength which is located between the first peak wavelength and the second peak wavelength, and closer to the second peak wavelength than to the first peak wavelength in the wavelength selection characteristics. The fourth dot is arranged not to be adjacent to the second dot, but is arranged to be adjacent to the first dot or the third dot.

As thus described, second dot and fourth dot whose peak wavelengths are close to each other in the wavelength characteristics are arranged not to be adjacent to each other, but the fourth dot is arranged to be adjacent to the first dot or the third dot. Thus, it is possible to prevent the deterioration of resolution caused by the adjacent arrangement of the second dot and the fourth dot when white light is illuminated to the color filter. Further, in the pixel construction with a striped arrangement, it is possible to suppress the generation of stripes caused by the adjacent arrangement of the second and the fourth dots, and to improve image display quality.

Further, in Patent Document as earlier mentioned, the reason why the resolution or the image display quality deteriorates is because first to fourth dots are arranged without considering human visibility. In contrast, in the present invention, dots whose peak wavelengths are close to each other, that is, dots which show almost the same color are separated from each other, and other dot is disposed between them. Thus, it is possible to display images that have improved in their resolution and image display quality in terms of human visibility.

In addition, the fourth dot is included in addition to the first to third dots as above, and first to fourth dots are arranged as above. Thus, it is possible to realize a very wide range of color reproduction and to display images with a wide wavelength range of display color close to that of natural light, and further it is possible to display images that have improved in their resolution and image display quality.

Further, in the color filter, first to fourth dots show different colors when white light is transmitted therethrough, and the display color of one of the first dot and the second dot is blue and that of the other dot is green, the display color of the third dot is red, and the display color of the fourth dot is cyan.

Accordingly, in the case the wavelength selection characteristics of the peak wavelength of 'C' is closer to that of the peak wavelength of 'B' than that of the peak wavelength of 'G', a construction may be employed in which the dots are arrayed such that the dot showing 'C' and the dot showing 'B' are arranged not to be adjacent to each other, but the dot showing 'C' dot is arranged to be adjacent to the dots showing 'G' or 'R'.

Further, in the case the wavelength selection characteristics of the peak wavelength of 'C' is closer to that of the peak wavelength of 'G' than that of the peak wavelength of 'B', a construction may be employed in which the dots are arrayed such that the dot showing 'C' and the dot showing 'G' are not arranged to be adjacent to each other, but the dot showing 'C' dot is arranged to be adjacent to the dots showing 'B' or 'R'.

According to the above construction, when white light is illuminated onto the color filter, it is possible to prevent the deterioration of the resolution caused by the adjacent arrangement of a dot whose peak wavelength is close to that of the dot showing 'C'. It is also possible to suppress the generation of stripes which was a problem in the pixel construction of the stripe arrangement, thereby improving its image display quality. Moreover, dots showing four colors of RGBC are included, and other dot is properly arranged to be adjacent to the dot showing 'C'. Thus, it is possible to realize a very wide range of color reproduction and to display images with a wide wavelength range of display color close to that of natural light, and further it is possible to display images that have improved in their resolution and image display quality.

Further, in the xy chromaticity characteristics, a left or upper left region of a line segment that connects coordinates of 'B' and 'G' with each other is larger than an upper right region of a line segment that connects coordinates of 'G' and 'R' with each other and a lower right region of a line segment that connects coordinates of 'R' and 'B' with each other. Therefore, the left or upper left region is a region which has a larger capability of representing color close to that of natural light. Thus, a color coordinate dot, which is located in the left or upper left region of the line segment that connects the coordinates of 'B' and 'G' with each other, i.e. the 'C' dot is included in a unit pixel, so that the color reproduction range in the region having such a large capability can be increased. Accordingly, it is possible to realize a wide wavelength range of display colors close to that of natural light.

Moreover, the color filter comprising four color dots including 'C' dot in a unit pixel can have a wider range of displayable region in the xy chromaticity characteristics than a color filter comprising other color dot in a unit pixel.

Further, in the color filter, first to fourth dots show different colors when white light is transmitted therethrough, and the display color of one of the first dot and the second dot is green and that of the other dot is red, the display color of the third dot is blue, and the display color of the fourth dot is yellow.

Accordingly, in the case the wavelength selection characteristics of the peak wavelength of 'Y' is closer to that of the peak wavelength of 'R' than that of the peak wavelength of 'G', a construction may be employed in which the dots are arrayed such that the dot showing 'Y' and the dot showing 'R' are arranged not to be adjacent to each other, but the dot showing 'Y' dot is arranged to be adjacent to the dots showing 'G' or 'B'.

Further, in the case the wavelength selection characteristics of the peak wavelength of 'Y' is closer to that of the peak wavelength of 'G' than that of the peak wavelength of 'R', a construction may be employed in which the dots are arrayed such that the dot showing 'Y' and the dot showing 'G' are arranged not to be adjacent to each other, but the dot showing 'Y' dot is arranged to be adjacent to the dots showing 'R' or 'B'.

According to the above construction, when white light is illuminated onto the color filter, it is possible to prevent the deterioration of the resolution caused by the adjacent arrangement of a dot whose peak wavelength is close to that of the dot showing 'Y'. It is also possible to suppress the generation of stripes which was a problem in the pixel construction of the stripe arrangement, thereby improving its image display quality. Moreover, dots showing four colors of RGBY are included and, other dot is properly arranged to be adjacent to the dot showing 'Y'. Thus, it is possible to realize a very wide range of color reproduction and to display images with a wide wavelength range of display color close to that of natural light, and further it is possible to display images that have improved in their resolution and image display quality.

In addition, the present invention provides an electronic apparatus comprising the display device as earlier described.

As such an electronic apparatus, information processing apparatuses such as portable telephones, mobile information terminals, clocks, word processors, and personal computers can be exemplified. In addition, televisions having a large-sized display screen, or large-sized monitors can be exemplified. As described above, the display device of the present invention is employed in a display unit of an electronic apparatus, so that it is possible to realize a very wide range of color reproduction and to display image with a wide wavelength range of display color, and further it is possible to display the images that have improved in their resolution and image display quality.

BRIEF DESCRIPTION OF THE DRAWINGS

FIG. 2 is a perspective view showing a sectional structure of the liquid crystal display device according to the first embodiment of the present invention;

FIGS. 3A and 3B are plan layouts of a color filter of the liquid crystal display device according to the first embodiment of the present invention;

FIGS. 8A and 8B are plan layouts showing an organic EL layer of the organic EL device according to the second embodiment of the present invention;

FIG. 9 is a plan layout showing the luminous wavelength characteristics of the organic EL device according to the second embodiment of the present invention;

DETAILED DESCRIPTION OF EMBODIMENTS

Figure 1:
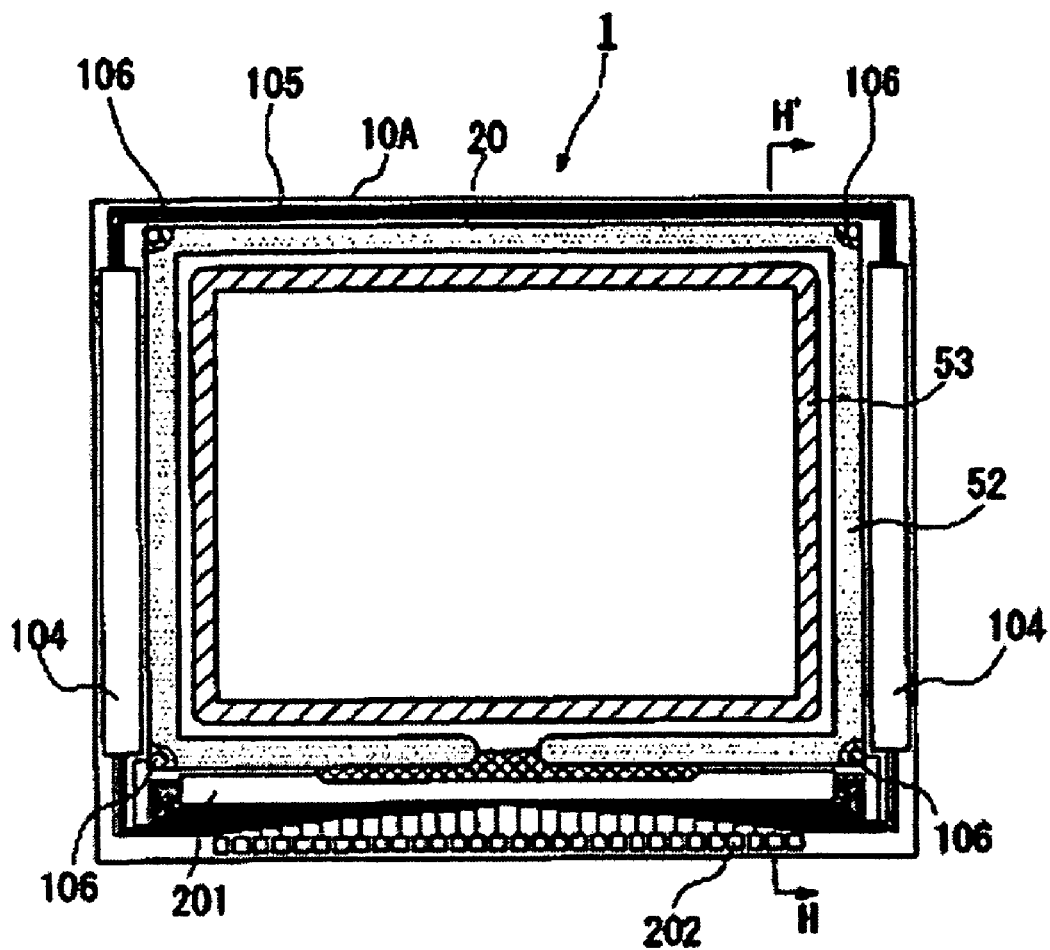
FIG. 1 is a plan view showing various elements of a liquid crystal display device according to the first embodiment of the present invention.

Hereinafter, preferred embodiments of the present invention will be described with reference to the accompanying drawings.

In addition, scales of respective layers and members in all the drawings are made different from each other so that the respective layers and members have sizes capable of being recognized in the drawings.

First Embodiment

Hereinafter, a first embodiment of the present invention will be described with reference to FIGS. 1 to 5.

In the present embodiment, an active matrix type transmissive liquid crystal display device in which thin film transistors (hereinafter simply referred to as TFTs) are used as switching elements will be described as an example.

Figure 4:
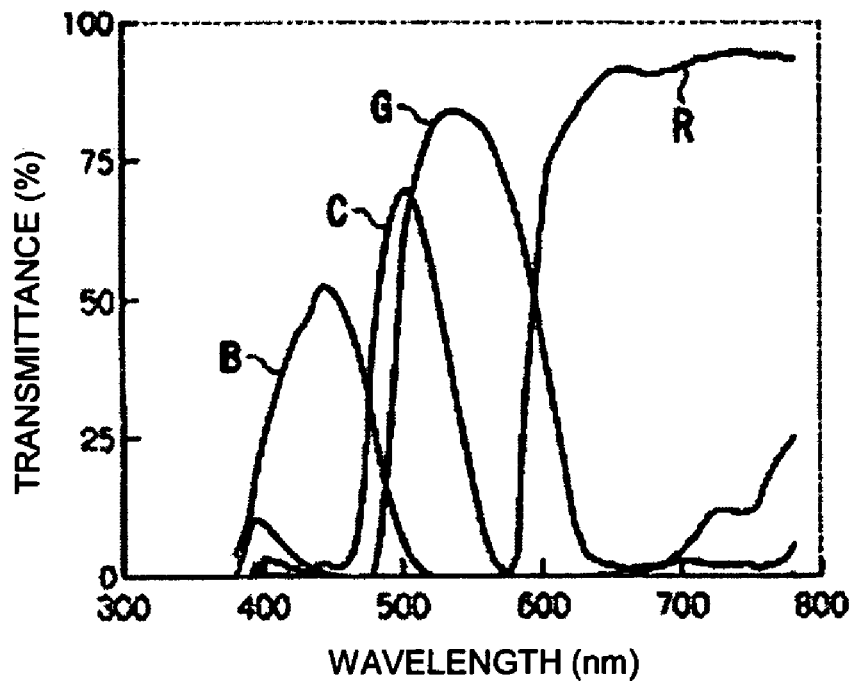
FIG. 4 is a graph showing the wavelength selection characteristics of the color filter in FIG. 1.
Figure 5:
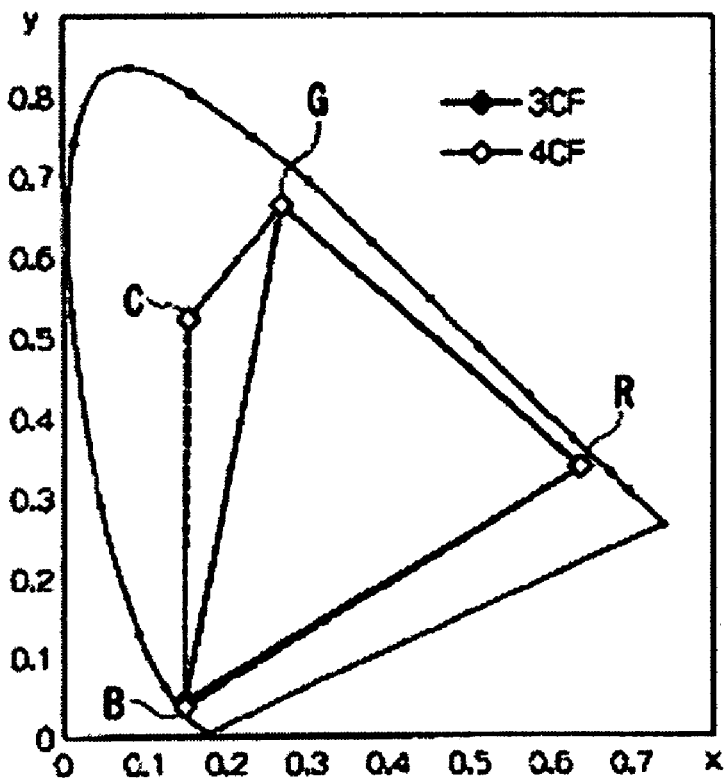
FIG. 5 is a graph showing the xy chromaticity characteristics of the liquid crystal display device according to the first embodiment of the present invention.

FIG. 1 is a plan view of the respective elements of a liquid crystal display device (or a display device) of the present embodiment as seen from the counter substrate side. FIG. 2 is a perspective view for explaining a sectional construction of the liquid crystal display device. FIG. 3 is a plan layout of a color filter in the liquid crystal display device. FIG. 4 is a graph illustrating the wavelength selection characteristics of the color filter. FIG. 5 is a graph for explaining the xy chromaticity characteristics of the color filter of the liquid crystal display device.

As shown in FIG. 1, a liquid crystal display device (display device) 1 of the present embodiment is constructed such that a TFT array substrate 10A and a counter substrate 10B are bonded to each other with a sealing material 52, and a liquid crystal layer 11 is encapsulated within a region partitioned by the sealing material 52. A light-shielding film 53 (peripheral partition) made of a light-shielding material is formed in the region where the sealing material 52 is formed. A data line driving circuit 201 and external circuit mounting terminals 202 are formed along one side of the TFT array substrate 10A in a peripheral circuit region outside the sealing material 52, and data line driving circuits 104 are formed along two sides of the TFT array substrate 10A adjacent to the above side. A plurality of wiring lines 105 is provided at the remaining side of the TFT array substrate 10A for connecting the scanning line driving circuits 104 provided at both sides of a display region. Further, inter-substrate electrical conduction members 106 are arranged at the corners of the counter substrate 10B for establishing an electrical conduction between the TFT array substrate 10A and the counter substrate 10B.

Further, as shown in FIG. 2, pixel electrodes 15 are formed at the inside of the TFT array substrate 10A, and a common electrode 16 are formed at the inside of the counter substrate 10B. Moreover, color filters 12 are formed between the pixel electrodes 15 and the common electrode 16.

Further, a backlight unit 13 and upper and lower polarizing plates 14A and 14B are formed outside the TFT array substrate 10A and the counter substrate 10B.

In addition, in the present embodiment, the 'inside' means a side where the liquid crystal layer 11 is formed, and the 'outside' means a side where the liquid crystal layer 11 is not disposed.

Now, the respective elements will be described.

The TFT array substrate 10A and the counter substrate 10B include a transparent substrate such as glass and plastic.

Further, the pixel electrodes 15 and the common electrode 16 are formed of a transparent conductor such as an indium tin oxide (ITO). Moreover, the pixel electrodes 15 are respectively connected to the corresponding thin film transistors (TFTs) built on the TFT array substrate 10A so that a voltage is applied to the liquid crystal layer 11 between the common electrode 16 and the pixel electrodes 15 according to the switching driving of the above TFTs.

The liquid crystal layer 11 has liquid crystal molecules whose alignment varies as the value of the voltage applied to by the common electrode 16 and the pixel electrodes 15. In the present embodiment, a TN mode that is twisted by 90 degrees between the TFT array substrate 10A and the counter substrate 10B is employed as a liquid crystal mode.

Further, such upper and lower polarizing plates 14A and 14B are arranged such that their transmission axes are orthogonal to each other.

In such liquid crystal layer 11 and upper and lower polarizing plates 14A and 14B, the alignment of liquid crystal molecules is varied according to the value of the voltage applied to the liquid crystal layer 11 so that the amount of the light transmitted through the liquid crystal layer 11 and the upper and lower polarizing plates 14A, 14B is varied. Accordingly, the liquid crystal layer 11 functions as a light amount controlling unit which controls the amount of incident light from the backlight unit 13 side to allow only a predetermined amount of the light to be transmitted therethrough to reach the observer side.

The backlight unit 13 functions as an illumination unit of the present invention, and is composed of a light source and a light guide plate. This construction allows the light emitted from the light source to be uniformly dispersed within the light guide plate and to emit source light in a direction represented by symbol A. The light source is composed of lighting tubes or white LEDs etc. The light guide plate is made of resin such as acryl.

The liquid crystal display device 1 having such a construction is a transmissive liquid crystal display device which emits the light from the backlight unit 13 to symbol A and derives the light from the counter substrate 10B. Accordingly, the source light of the backlight unit 13 is used to perform liquid crystal display.

Next, a construction of the color filters 12 will be described.

FIG. 3 shows a color filter 12 in which four dots forms one pixel. In this drawing, the construction of a pixel composed of four color dots including a cyan (C) dot in addition to three color dots, i.e. red (R), green (G) and blue (B) dots is illustrated. Further, as shown in a plan layout of FIG. 3(*a*), the color filter 12 has a construction comprising the respective color dots in the order of R/G/B/C dots from the left. In addition, in the present embodiment, a layout as shown in FIG. 3(*b*), i.e. a construction comprising the respective color dots in the order of B/G/R/C dots from the left may be employed. The color filters 12 having such a dot construction are arranged over the entire surface of the display region of the liquid crystal display device 1.

Further, the respective R/G/B/C dots are illuminated with white light from the backlight unit 13, thereby allowing a predetermined wavelength range of light, in other words, a predetermined color of light, which is included in the white light, to be transmitted therethrough to reach the observer side. Accordingly, each of the R/G/B/C dots is a colored layer which constitutes the color filter 12, and functions as a wavelength selecting element of the present invention.

FIG. 4 shows wavelength selection characteristics of the color filter 12. The peak wavelengths of B, C, G and R show over 450 nm, 510 nm, 550 nm, and 620 nm respectively.

Also, the present embodiment employs an array in which a dot (a second dot) having a peak wavelength (a second peak wavelength) of either B or G close to a peak wavelength of 'C' (a fourth peak wavelength) is arranged not to be adjacent to 'C' dot (the fourth dot).

Moreover, the present embodiment employs an array in which a dot of B or C having a peak wavelength (a first peak wavelength) remote from the peak wavelength of C, or a dot having a peak wavelength (a third peak wavelength) remoter from the peak wavelength of C is arranged to be adjacent to 'C' dot.

Specifically, as can be seen by referring to the wavelength selection characteristics in FIG. 4, the difference between the peak wavelengths of B and C is 60 nm (510 nm–450 nm), and the difference between the peak wavelengths of G and C is 40 nm (550 nm–510 nm). Therefore, the peak wavelength (the four peak wavelength) of 'C' is closer to the peak wavelength (the second peak wavelength) of 'G'. Further, the peak wavelength of 'C' is remote from the peak wavelength (the first peak wavelength) of 'B'.

Accordingly, a dot array is employed in which the 'G' dot (the second dot) is arranged not to be adjacent to the 'C' dot (the fourth dot), but the 'B' dot (the first dot) or the 'R' dot (the third dot) is arranged to be adjacent to the 'C' dot (the fourth dot). Thus, as shown in FIG. 3(*a*), a pixel structure in which the R/G/B/C dots are arrayed in the order from the left is employed, or as shown in FIG. 3(*b*), a pixel structure in which the B/G/R/C dots is arrayed in the order from the left is employed.

Next, referring to FIG. 5, xy chromaticity characteristics which are obtained by comparing the liquid crystal display device 1 having a pixel construction composed of four color dots (4CF) with a liquid crystal display device having a pixel construction composed of three color (RGB) dot (3CF) are shown and described. In the pixel construction of the three color dots, it is possible to realize colors in a triangular region of the xy chromaticity characteristics, while in the pixel construction of the four color dots, it is possible to realize colors in a quadrangle region of the xy chromaticity characteristics. Accordingly, the liquid crystal display device 1 of the present embodiment having the pixel construction of four color dots can realize a wide color gamut. Further, the liquid crystal display device 1 can accomplish an NTSC ratio of 115%.

As described above, the present embodiment has the construction in which 'G' dot and 'C' dot whose peak wavelengths in the wavelength selection characteristics are close to each other are arranged not to be adjacent to each other, but 'C' dot is arranged to be adjacent to 'B' dot or 'R' dot. Thus, it is possible to realize a liquid crystal display device which can prevent apparent resolution from deteriorating and prevent striped lines from being generated, can improve its image display quality, and allow a wide color gamut of image display.

Here, the pixel construction of the present embodiment will be described while comparing with a construction in which 'C' dot and 'G' dot are arranged to be adjacent to each other. As shown in FIG. 4, since 'C' and 'G' have very close hues, if the two dots are arranged to be adjacent to each other, the apparent resolution of the liquid crystal display device may deteriorate, and striped lines may be seen in the pixel construction with a striped array. The reason why the resolution or the image display quality deteriorates as such is because the four color dots are arranged without considering human visibility.

In contrast, in the liquid crystal display device 1 of the present embodiment, dots whose peak wavelengths are close to each other, that is, 'C' and 'D' dots which show almost the same color are separated from each other, and other dot ('R' or 'B') is disposed between them. Thus, it is possible to display images that have improved in their resolution and image display quality in terms of human visibility. Accordingly, it is possible to realize a liquid crystal display device which can prevent apparent resolution from deteriorating and prevent striped lines from being generated, can improve its image display quality, and allows a wide color gamut of image display.

Further, 'C' dot is included in addition to RGB dots as above and the array of 'C' is defined as above. Thus, it is possible to realize a very wide range of color reproduction and to display image with a wide wavelength range of display color close to that of natural light, and further it is possible to display images that have improved in their resolution and image display quality.

Further, in the xy chromaticity characteristics, a left or upper left region of a line segment that connects coordinates of 'B' and 'G' with each other is larger than an upper right region of a line segment that connects coordinates of 'G' and 'R' with each other and a lower right region of a line segment that connects coordinates of 'R' and 'B' with each other. Therefore, the left or upper left region is a region which has a larger capability of representing colors closer to that of natural light. Thus; a color coordinate dot, which is located in the left or upper left region of the line segment that connects the coordinates of 'B' and 'G' with each other i.e. the 'C' dot is included in a unit pixel, so that the color reproduction range in the region having such a large capability can be increased. Accordingly, it is possible to realize a wide wavelength range of display color close to that of natural light.

Moreover, the liquid crystal display device 1 comprising four color dots including 'C' dot in a unit pixel can have a wider range of displayable region in the xy chromaticity characteristics than a liquid crystal display device comprising other color dot such as 'Y' dot in a unit pixel.

Further, the liquid crystal display device 1 comprises RGBC dots and the liquid crystal layer 11 which controls the amount of light transmitted through the dots. Thereby, the respective RGBC dots transmit light with the wavelength selection characteristics of the RGBC colors, and the liquid crystal layer 11 controls the amount of transmitted light. Thus, it is possible to realize a very wide range of color reproduction, and to display a wide wavelength range of display color close to that of natural light with the transmitted light. Moreover, since the respective RGBC dots are properly defined and arranged as above, it is possible to display images that have improved in their resolution and image display quality.

Further, the liquid crystal display device 1 comprises the backlight unit 13 which illuminates white light onto the respective RGBC dots. Thereby, the backlight unit 13 illuminates the RGBC dots with white light, the RGBC dots transmit light with the wavelength selection characteristics of the RGBC colors, and the liquid crystal layer 11 controls the amount of transmitted light. Thus, it is possible to realize a very wide range of color reproduction, and to display a wide wavelength range of display color close to that of natural light with the transmitted light. Moreover, since the RGBC dots are properly defined and arranged as above, it is possible to display images that have improved in their resolution and image display quality.

In addition, a dot array in which 'C' and 'G' dots are arranged not to be adjacent to each other, but 'C' dot is arranged to 'R' or 'B' dot is employed in the present embodiment, but the present invention is not limited thereto. For example, in the case the wavelength selection characteristics of the peak wavelength (the fourth peak wavelength) of 'C' is closer to that of the peak wavelength (the second peak wavelength) of 'B' than that of the peak wavelength (the first peak wavelength) of 'G', a construction may be employed in which the 'C' dot (the fourth dot) and the 'B' dot (the second dot) are arranged not to be adjacent to each other, but the 'C' dot is arranged to be adjacent to 'G' dot (the first dot) or the 'R' dot (the third dot). By this construction, it is possible to prevent the deterioration of resolution caused by the adjacent arrangement of display elements showing 'B' and 'C' whose peak wavelengths are close to each other. Further, in the pixel construction with a striped arrangement, it is possible to suppress the generation of stripes caused by the adjacent arrangement of display elements showing 'B' and 'C', thereby improving image display quality.

Modification of First Embodiment

Next, a modification of the first embodiment will be described below.

In addition, the same elements as those of the first embodiment are denoted by the same reference numerals, and the description thereof will be simplified.

Although the transmissive liquid crystal display device has been described in the first embodiment as earlier described, in the present modification, a case in which the color filter 12 having a dot array defined as above is employed in a reflective liquid crystal display device will be described.

In this case, the liquid crystal display device 1 has a construction which comprises a reflecting portion which reflects external light and illuminates the reflected light onto the respective RGBC dots. Referring a specific example of the reflecting portion, a construction provided with a metal plate or a substrate having a metallic reflecting film formed thereon instead of the backlight unit 13 is employed.

In such a reflective liquid crystal display device, the reflecting portion reflects external light, the reflected light is illuminated onto the respective dots, and the reflected light is transmitted with wavelength selection characteristics of the respective RGBC colors. Moreover, the liquid crystal layer 11 controls the amount of transmitted light of the reflected light.

As described above, in the present modification, it is possible to realize a very wide range of color reproduction, and to display a wide wavelength range of display color closer to that of natural light. Moreover, since the respective RGBC dots are properly defined and arranged as above, it is possible to display images that have improved in their resolution and image display quality.

In addition, although the reflective liquid crystal display device has been described in the above, the dot array can also be applied to a transflective liquid crystal display device comprising a reflecting portion. The transflective liquid crystal display device employs a construction which comprises the backlight unit 13 and the above reflecting portion outside the backlight unit 13.

Further, a multi-gap structure in which a transmissive display region and a reflective display region are provided in each of the RGBC dots can be employed as another form of the transflective liquid crystal display device. In this multi-gap structure, a construction is employed in which a reflecting portion made of a resinous scattering film or a metallic reflecting film is provided only in the reflective display region. Further, display using the illuminated light from the backlight unit 13 is performed in the transmissive display region.

In such a transflective liquid crystal display device, when the reflecting portion reflects external light, and when the backlight unit 13 illuminates, the respective RGBC dots are illuminated, and the reflected light or illuminated light are transmitted through the dots with the wavelength selection characteristics of the RGBC colors. Moreover, the liquid crystal layer 11 controls the amount of the transmitted light.

As described above, in the present modification, it is possible to realize a very wide range of color reproduction, and to display a wide wavelength range of display color close to that of natural light. Moreover, since the respective RGBC dots are properly defined and arranged as above, it is possible to display images that have improved in their resolution and image display quality.

Other Modification of First Embodiment

Next, other modification of the first embodiment will be described below.

In addition, the same elements as those of the first embodiment are denoted by the same reference numerals, and the description thereof will be simplified.

In the previous first embodiment, the color filter 12 having an array of four color dots in which 'C' dot is added to the three color (RGB) dots has been described. Hereinafter, a color filter which employs Y dot instead of 'C' dot will be described.

In other words, the color filter 12 comprises Y dot (the fourth dot or a wavelength selecting element) in addition to three color (RGB) dots within a unit pixel.

Here, in the case the wavelength selection characteristic of the peak wavelength (the fourth peak wavelength) of 'Y' is closer to that of the peak wavelength (the second peak wavelength) of 'R' than that of the peak wavelength (the first peak wavelength) of 'G', a construction is employed in which the four color dots is arrayed such that 'Y' dot (the fourth dot) and 'R' dot (the second dot) are arranged not to be adjacent to each other, but 'Y' dot is arranged to be adjacent 'G' dot (the first dot) or 'B' dot (the third dot). That is to say, a pixel structure in which G/R/B/Y are arrayed in the order or B/R/G/Y are arrayed in the order is employed.

Further, in the case the wavelength selection characteristic of the peak wavelength (the fourth peak wavelength) of 'Y' is closer to that of the peak wavelength (the second peak wavelength) of 'G' than that of the peak wavelength (the first peak wavelength) of 'R', a construction is employed in which the four color dots is arrayed such that 'Y' dot (the fourth dot) and 'G' dot (the second dot) are arrahgedhot to be adjacent to each other, but 'Y' dot is arranged to be adjacent 'R' dot (the first dot) or 'B' dot (the third dot). In brief, a pixel structure in which R/G/B/Y are arrayed in the order of B/G/R/Y is employed. See FIG. 12B.

According to the above construction, when illumination light from the backlight unit 13 is illuminated onto the color filter 12, it is possible to prevent the deterioration of the resolution caused by the adjacent arrangement of dot whose peak wavelength is close to that of the dot showing 'Y'. It is also possible to suppress the generation of stripes which was a problem in the pixel construction of the stripe arrangement, thereby improving its image display quality. Moreover, dots showing four colors of RGBY are included and, other dot is properly arranged to be adjacent to a dot showing 'Y'. Thus, it is possible to realize a very wide range of color reproduction and to display images with a wide wavelength range of display color close to that of natural light, and further it is possible to display the images that have improved in their resolution and image display quality.

Second Embodiment

Hereinafter, a second embodiment of the present embodiment will be described with reference to FIGS. 6 to 10.

In the present embodiment, an active matrix type organic EL device in which TFTs are used as switching elements will be described as an example. In particular, The organic EL device is a color organic EL display device comprising four kinds (RGBC) of high-molecular-weight organic light-emitting layers.

Figure 6:
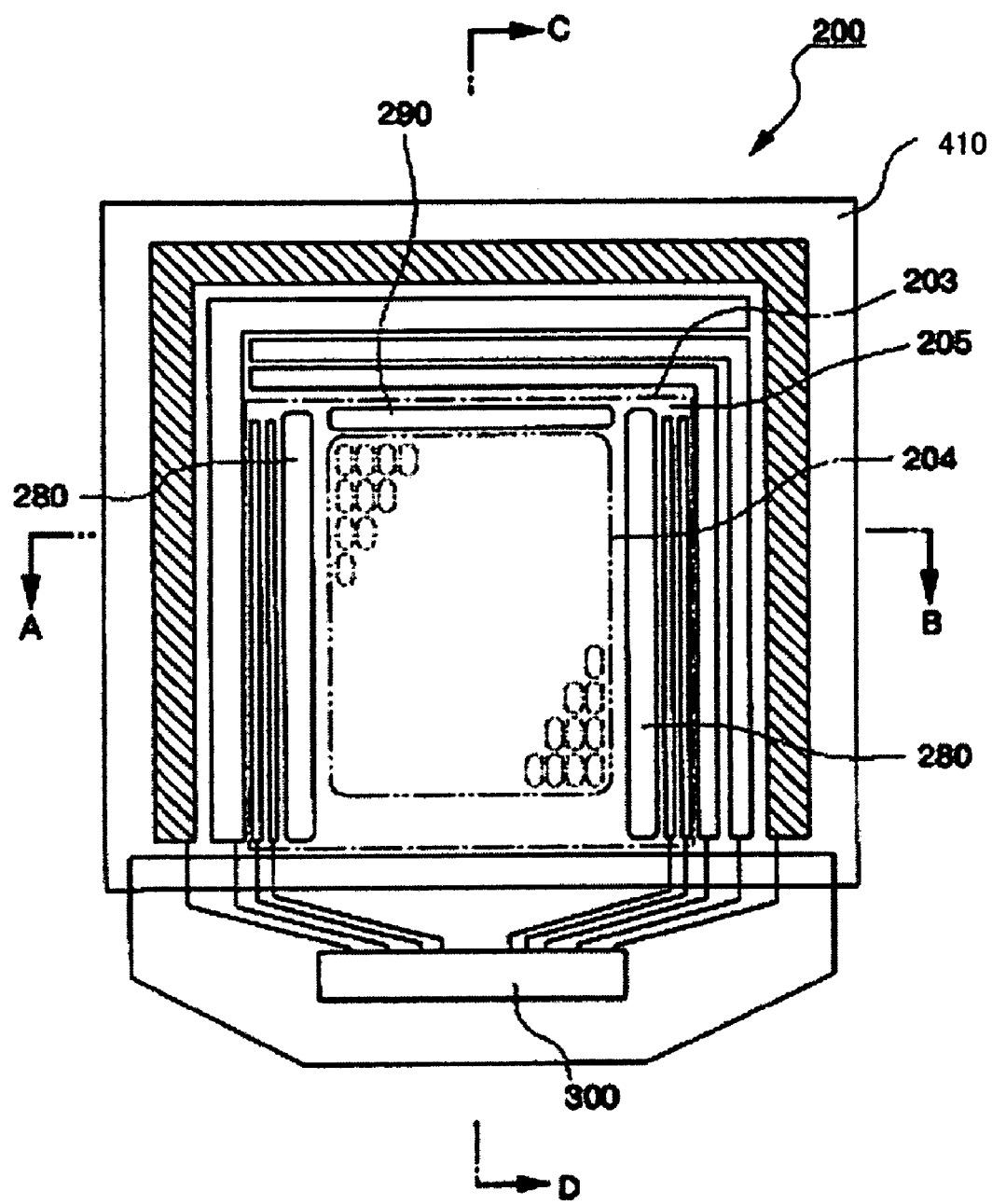
FIG. 6 is a plan view showing various elements of an organic EL device according to the second embodiment of the present invention.
Figure 7:
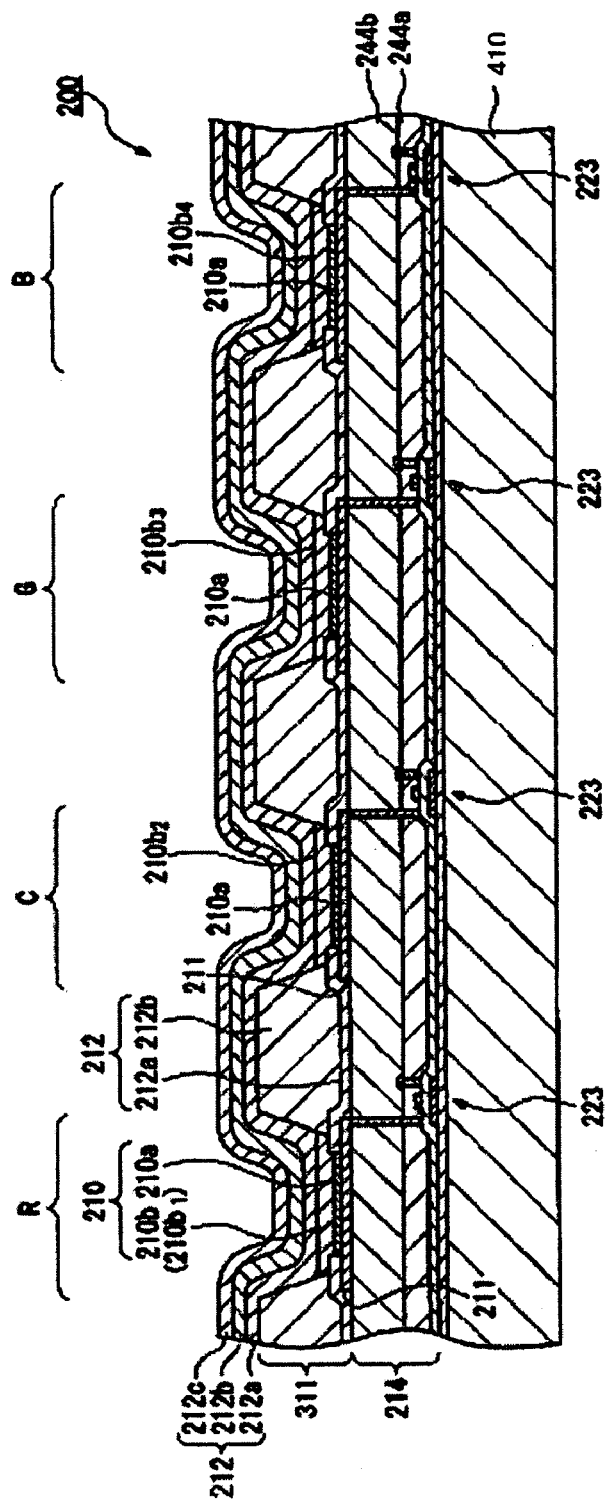
FIG. 7 is an enlarged cross-sectional view showing the pixel structure of the organic EL device according to the second embodiment of the present invention.
Figure 10:
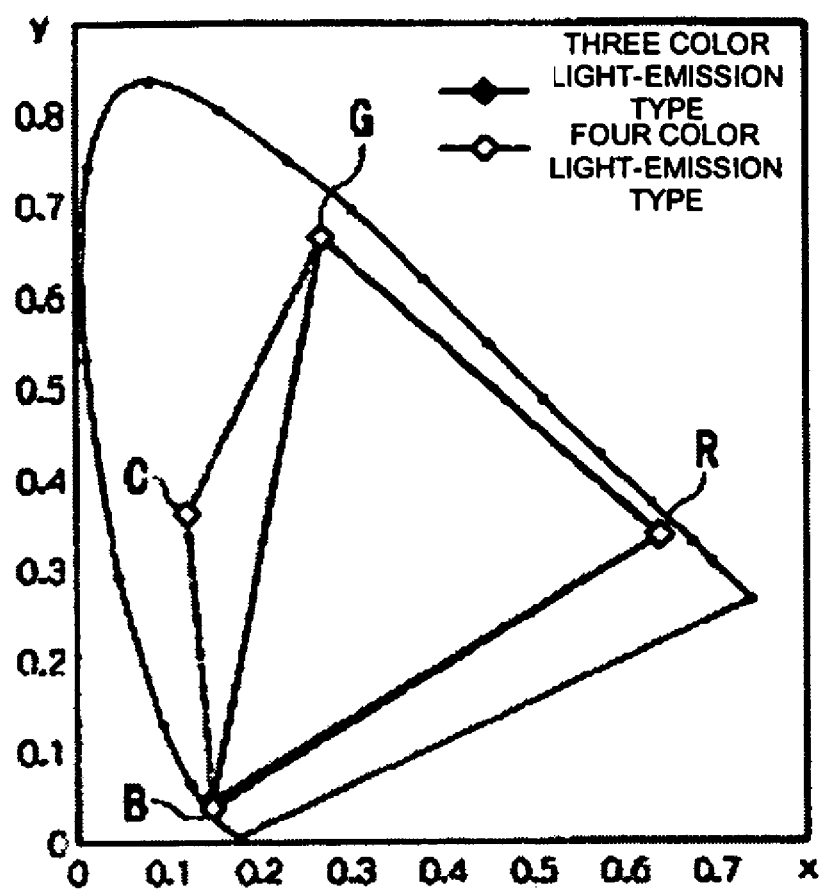
FIG. 10 is a graph showing the xy chromaticity characteristics of emitting light of the organic EL device according to the second embodiment of the present invention.

FIG. 6 shows a planar structure of an organic EL device of the present embodiment. FIG. 7 is an enlarged cross-sectional view showing a pixel structure of the organic EL device. FIG. 8 is a plan layout of an organic EL layer in the organic EL device. FIG. 9 shows emission wavelength characteristics of the organic EL device. FIG. 10 is a graph for explaining xy chromaticity characteristics of the emitting light of the organic EL device.

As shown in FIG. 6, an organic EL device (a display device) 200 of the present embodiment comprises a substrate 210 with an electrical insulating property, a pixel electrode region in which pixel electrodes connected to switching TFTs (which will be described below) are arranged in a matrix state on the substrate 210, and a pixel unit 203 (within a frame denoted by one-dot chain lines in the drawing) located on at least the pixel electrode region and having a substantially rectangular shape in a plan view. Further, the pixel unit 203 is partitioned by a central substantial display region 204 (within a frame indicated two-dot chain lines), and a dummy region 205 (a region between the one-dot chain lines and the two-dot chain lines) arranged around the substantial display region 204.

On the substantial display region 204, display regions R, C, G and B respectively having pixel electrodes are arranged in such a manner to be separated from each other in an A-B direction and in a C-D direction. Further, scanning line driving circuits 280 are disposed on both sides of the substantial display region 204 in the drawing. The scanning line driving circuits 280 are located below the dummy region 205. Moreover, a test circuit 290 is disposed at the upper part of the figure of the substantial display region 204. The test circuit 290 is located below the dummy region 205. The test circuit 290 is a circuit for testing an operating state of the organic EL device 200. For example, the test circuit 290 comprises test information output means (not shown in figures) that outputs the test result to the exterior, and is configured to perform the quality or defect test of display devices during manufacturing or shipment.

Driving voltages of the scanning line driving circuits 280 and the test circuit 290 are applied via driving-voltage conducting portions from a predetermined power supply. Further, driving control signals and driving voltages to these scanning line driving circuits 280 and test circuit 290 are respectively transmitted and applied via driving control signal conducting portions etc. from a predetermined main driver which controls the operation of the organic EL device 200. In addition, in this case, the driving control signals are command signals from the main driver etc. related to the control when the scanning line driving circuits 280 and the test circuit 290 output signals.

Next, a pixel structure of the organic EL device 200 will be described with reference to FIG. 7.

FIG. 7 is an enlarged view of a sectional structure of the display region in the above organic EL device 200.

In FIG. 7, a sectional structure of four display regions corresponding to the respective R/C/G/B colors is shown. The organic EL device 200 is constructed such that a circuit element portion 214 having circuits such as TFTs formed therein, a light-emitting portion 311 having pixel electrodes 211, functional layers 210, etc. formed therein, and a cathode 212 are sequentially laminated on the substrate 210.

In the organic EL device 200, the light emitted to the substrate 210 from the functional layers 210 is transmitted through the circuit element portion 214 and the substrate 210 and is emitted to the bottom (the observer side) of the substrate 210, while the light emitted to the side opposite to the substrate 210 from the functional layers 210 is reflected by the cathode 212, and is transmitted through the circuit element portion 214 and the substrate 210, and is emitted to the bottom (the observer side) of the substrate 210.

The circuit element portion 214 is formed with a base protective film such as silicon oxide film on the substrate 210, a driving TFT 223 connected to each pixel electrode 211, and interlayer insulating films 244a and 244b.

The light-emitting portion 311 essentially comprises the functional layers 210 respectively laminated on the plurality of pixel electrodes 211, and bank parts 212 which are disposed between the functional layers 210 to partition the respective functional layers 210. The cathode 212 is disposed on the functional layers 210.

In the light-emitting portion 311, each bank part 212 is constructed such that an inorganic bank layer 212a located at the substrate 210 and an organic bank layer 212b located apart from the substrate 210 are laminated.

Further, each functional layer 210 comprises a hole injecting/transporting layer 210a laminated on the pixel electrodes 211, and an organic EL layer 210b formed adjacently to the hole injecting/transporting layer 210a.

The hole injecting/transporting layer 210a has a function to inject a hole into the organic EL layer 210b, and has function to transport a hole in the hole injecting/transporting layer 210a. Such hole injecting/transporting layer 210a is proved the pixel electrodes 211 and the organic EL layer 210b, so that the element characteristics, such as luminous efficiency and lifetime, of the organic EL layer 210b are improved. A hole injected from the hole injecting/transporting layer 210a and an electron from the electrode 212 are coupled with each other in the organic EL layer, so that the emission of light is obtained.

The cathode 212 is formed on the entire surface of the light-emitting portion 311, and makes a couple with each of the pixel electrodes 211 to play a part of flowing a current through the function layer 210. This cathode 212 is constructed such that a lithium fluoride layer 212a, a calcium layer 212b, and an aluminum layer 212c are sequentially laminated.

The organic EL layer 210b comprises four kinds of layers, i.e., a red organic EL layer 210b1 which emits light in red (R), a cyan organic EL layer 210b2 which emits light in cyan (C), a green organic EL layer 210b3 which emits light in green (G), and a blue organic EL layer 210b4 which emits light in blue (B), all of which have different luminous wavelength bands, respectively. The respective organic EL layers 210b1 to 210b4 are arranged in a predetermined array (for example, in stripes).

Further, the organic EL layers 210b1 to 210b4 are formed by applying composition ink prepared by the mixing of a solvent with a high polymer material for an organic EL layer with an inkjet method. Further, such organic L layer 210b1 to 210b4 functions as a light emitting element of the present invention.

Therefore, as shown in a plan layout of FIG. 8(a), the organic EL layer 210b has a construction comprising the respective color dots in the order of R/C/G/B dots from the left. In addition, in the present embodiment, a layout as shown in FIG. 3(b), i.e. a construction comprising the respective color dots in the order of B/G/R/C dots from the left may be employed. Further, the organic EL layers 210b having such a dot construction are arranged over the entire surface of the substantial display region 204 of the organic EL device 200 shown in FIG. 6.

FIG. 9 shows the wavelength selection characteristics of the organic EL device. The peak wavelengths of B, C, G and R show over 470 nm, 500 mn, 550 mn, and 640 nm respectively.

Also, the present embodiment employs an array in which a dot (a second dot) having a peak wavelength (a second peak wavelength) of either B or G close to a peak wavelength (a fourth peak wavelength) of 'C' is arranged not to be adjacent to a 'C' dot (a fourth dot).

Moreover, the present embodiment employs an array in which a dot having a peak wavelength (a first peak wavelength) remote from the peak wavelength of C, or a dot of B or G having a peak wavelength (a third peak wavelength) remoter from the peak wavelength of C is arranged to be adjacent to the 'C' dot.

Specifically, as can be seen by referring to the wavelength selection characteristics in FIG. 9, the difference between the peak wavelengths of B and C is 30 nm (500 nm–470 nm), and the difference between the peak wavelengths of G and C is 50 nm (550 nm–500 nm). Therefore, the peak wavelength (the four peak wavelength) of 'C' becomes closer to the peak wavelength (the second peak wavelength) of 'B'. Further, the peak wavelength of 'C' becomes remote from the peak wavelength (the first peak wavelength) of 'G'.

Accordingly, a dot array is employed in which 'B' dot (the second dot) is arranged not to be adjacent to 'C' dot (the fourth dot), but 'G' dot (the first dot) or 'R' dot (the third dot) is arranged to be adjacent to 'C' dot (the fourth dot). Thus, as shown in FIG. 7 or FIG. 8(a), a pixel structure in which the R/C/G/B/ are arrayed in the order from the left is employed, or as shown in FIG. 8(b), a pixel structure in which the G/C/R/B dots are arrayed in the order from the left is employed.

Next, referring to FIG. 10, xy chromaticity characteristics which are obtained by comparing a luminescence property of the organic EL device 200 (four color light-emission type) comprising a pixel construction of four color dots with a luminescence property of an organic EL device (three color light-emission type) comprising a pixel construction of three color dots will be described. In the pixel construction of the three color dots, it is possible to realize colors in a triangular region of the xy chromaticity characteristics, while in the pixel construction of the four color dots, it is possible to realize colors in a quadrangle region of the xy chromaticity characteristics. Accordingly, the organic EL device 200 of the present embodiment having the pixel construction of the four color dots can realize a wide color gamut. Further, the organic EL device 200 can accomplish an NTSC ratio of 120%.

As described above, the present embodiment has the construction in which 'B' dot and 'C' dot whose peak wavelengths in the luminous wavelength characteristics are close to each other are arranged not to be adjacent to each other, but 'C' dot is arranged to be adjacent to 'G' dot or 'R' dot. Thus, it is possible to realize an organic EL device which can prevent apparent resolution from deteriorating and prevent striped lines from being generated, can improve its image display quality, and allow a wide color gamut of image display.

Here, the pixel construction of the present embodiment will be described while comparing with a construction in which 'C' dot and 'B' dot are arranged to be adjacent to each other. As shown in FIG. 9, since 'C' and 'B' has very close hues, if the two dots are arranged to be adjacent to each other, the apparent resolution of the organic EL device may deteriorate, and striped lines may be seen in the pixel construction with a striped array. The reason why the resolution or the image quality deteriorates as such is because the four color dots are arranged without considering human visibility.

In contrast, in the organic EL device 200 of the present embodiment, dots whose peak wavelengths are close to each other, that is, 'C' and B' dots which show almost the same color are separated from each other, and other dot ('R' or 'G') is disposed between them. Thus, it is possible to display images that have improved in their resolution and image display quality in terms of human visibility. Accordingly, it is possible to realize an organic EL device which can prevent apparent resolution from deteriorating and prevent striped lines from being generated, can improve image display quality, and allows a wide color gamut of image display.

Further, 'C' dot is included in addition to RGB dots as above and the array of 'C' is defined as above. Thus, it is possible to realize a very wide range of color reproduction and to display images with a wide wavelength range of display color close to that of natural light, and further it is possible to display images that have improved in their resolution and image display quality.

Further, in the xy chromaticity characteristics, a left or upper left region of a line segment that connects coordinates of 'B' and 'G' with each other is larger than an upper right region of a line segment that connects coordinates of 'G' and 'R' with each other and a lower right region of a line segment that connects coordinates of 'R' and 'B' with each other. Therefore, the left or upper left region is a region which has a larger capability of representing colors closer to that of natural light. Thus, a color coordinate dot, which is located in the left or upper left region of the line segment that connects the coordinates of 'B' and 'G' with each other, i.e. 'C' dot is included in a unit pixel, so that the color reproduction range in the region having such a large capability can be increased. Accordingly, it is possible to realize a wide wavelength range of display color close to that of natural light.

Moreover, the organic EL device 200 comprising four color dots including 'C' dot in a unit pixel can has a wider range of displayable region in the xy chromaticity characteristics than an organic EL device comprising other color dot such as 'Y' dot in a unit pixel.

In addition, a dot array in which 'C' and 'B' dots are arranged not to be adjacent to each other, but 'C' dot is arranged to 'R' or 'G' dot is employed in the present embodiment, but the present invention is not limited thereto. For example, in the luminous wavelength characteristics, in the case in which the peak wavelength (the fourth peak wavelength) of 'C' is closer to the peak wavelength (the second peak wavelength) of 'G' than the peak wavelength (the first peak wavelength) of 'B', a construction may be employed in which 'C' dot (the fourth dot) and 'G' dot (the second dot) are arranged not to be adjacent to each other, but 'C' dot is arranged to be adjacent to 'B' dot (the first dot) or 'R' dot (the third dot). By this construction, it is possible to prevent the deterioration of resolution caused by the adjacent arrangement of display elements showing 'G' and 'C' whose peak wavelengths are close to each other. Further, in the pixel construction with a striped arrangement, it is possible to suppress the generation of stripes caused by the adjacent arrangement of display elements showing 'B' and 'C' and to improve its image display quality.

Figure 12A:
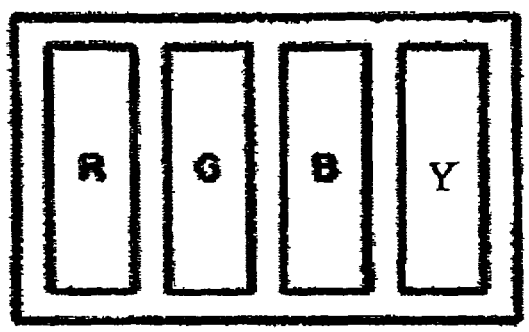
FIGS. 12A-12D show plan layouts of an organic EL layer of the organic EL device according to variations of the present invention.
Figure 12B:
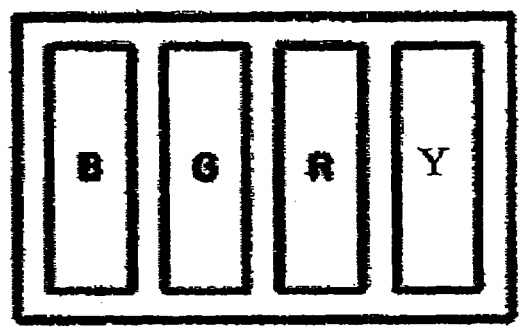
Figure 12C:
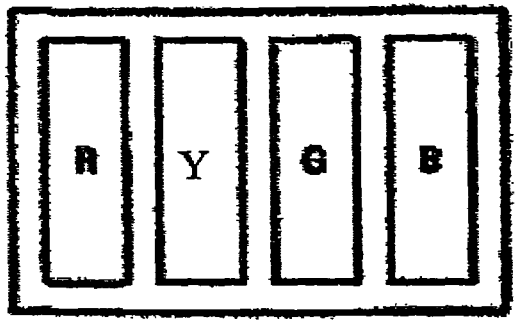
Figure 12D:
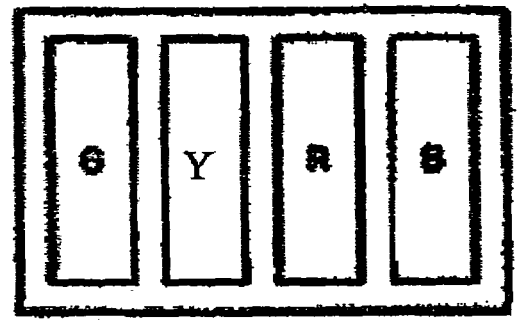

Although the pixel construction having four color dots in which 'C' dot is added to the three color (RGB) dots in the present embodiment, has been described, a pixel construction in which Y dot is employed instead of 'C' dot may be employed. Similarly to the above, in this case and as shown in FIGS. 12A-12D, in the luminous wavelength characteristics, a dot having a peak wavelength close to the peak wavelength of 'Y' and 'Y' dot are arranged not to be adjacent to each other, but a dot having a peak wavelength remote from the peak wavelength of 'Y' and 'Y' dot are arranged to be adjacent to each other. For example, 'Y', having a peak wavelength closer to the peak wavelength of 'G' than the peak wavelength of 'B', can be placed adjacent to only 'B', as in R/G/B/Y, as shown in FIG. 12A. Similarly, if the peak wavelength of 'Y' is chosen closer to the peak wavelength of 'G' than 'R', a layout of B/G/R/Y as shown in FIG. 12B can be used. As a result, the same effects as those as previously described can be obtained. In contrast, layouts of R/Y/G/B and G/Y/R/B, shown in FIGS. 12C and 12D, respectively, would retain the problems of, for example, a visual merging of adjacent dots into a single perceived dot and the resulting possibility of perceived stripes across multiple pixels.

Further, although the organic EL device 200 comprising the high-molecular-weight organic light-emitting layers has been described in the present embodiment, the present invention can also be applied to an organic EL device 200 comprising low-molecular-weight organic light-emitting layers. Further, the present invention, not limited to the organic EL device, can also be applied to display devices such as an LED display device, a plasma display device, a cathode-ray tube (CRT) display device and a digital micro-mirror device (DMD), all of which comprises a plurality of colored dots in a unit pixel. In this case, the same effects as above can be obtained.

In addition, although the display devices (the liquid crystal display device 1 and the organic EL device 200) each comprising four dots have been described in the first and second embodiments, five color dots or six color dots in which other dots having other range of wavelength are further added to the four color dots may be constructed. In this case, the array of four color dots including RGB dots is defined as in the above embodiments, the same effects as above can be obtained.

Electronic Apparatus

Figure 11:
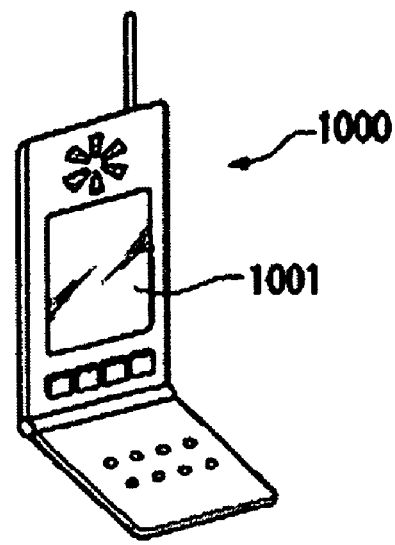
FIG. 11 illustrates electronic apparatuses comprising the display device of the present invention.
Figure 11:
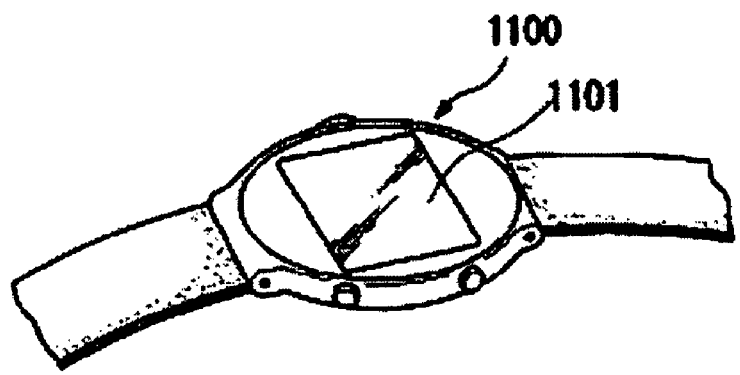
Figure 11:
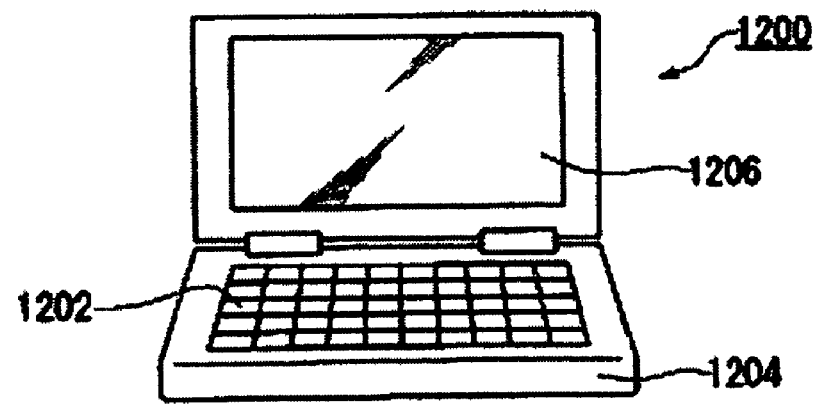

FIGS. 11(a) to 11(c) show an embodiment of an electronic apparatus of the present invention.

The electronic apparatus of this example comprises the above-mentioned liquid crystal display device or organic EL device as display means.

FIG. 11(a) is a perspective view showing an example of a mobile telephone. In FIG. 11(a), the reference numeral 1000 denotes a main body of the mobile telephone, and the reference numeral 1001 denotes a display unit using the display device:

FIG. 11(b) is a perspective view showing an example of a wristwatch type electronic apparatus. In FIG. 11(b), the reference numeral 1100 denotes a main body of the watch, and the reference numeral 1101 denotes a display unit using the display device.

FIG. 11(c) is a perspective view showing an example of a portable information processing apparatus such as a word processor and a personal computer. In FIG. 11(c), the reference numeral 1200 denotes an information processing apparatus, the reference numeral 1202 denotes an input unit such as a keyboard, the reference numeral 1204 denotes a main body of the information processing apparatus, and the reference numeral 1206 denotes a display unit using the display device.

Since the respective electronic apparatuses shown in FIG. 11(a) to 11(c) comprises the display device of the present invention in their display units, it is possible to realize an electronic apparatus which can realize a very wide range of color reproduction and display images with a wide wavelength range of display color close to that of natural light, and further can display images that have improved in their resolution and image display quality.

Although the preferred embodiments according to the present invention has been described referring to the accompanying drawings, it is obvious that the present invention is not limited to such preferred embodiments. The shapes or the combinations of the components described in the above preferred embodiments are just examples, and therefore various modifications can be made in accordance with, for example, necessities in design within a scope and/or spirit of the present invention.

What is claimed is:

1. A liquid crystal display device comprising:
   a plurality of dots in a unit pixel, the dots of the unit pixel being arranged in a line, the dots including:

first to third dots respectively having first to third peak wavelengths in the wavelength characteristics of emitted light, and a fourth dot having a fourth peak wavelength which is located between the first peak wavelength and the second peak wavelength, the fourth peak wavelength being closer to the second peak wavelength than to the first peak wavelength, in the wavelength characteristics, wherein the fourth dot is arranged not to be adjacent to the second dot, but is arranged to be adjacent to the first dot or the third dot.

2. The liquid crystal display device according to claim 1, wherein the display color of one of the first dot and the second dot is blue and that of the other dot is green, the display color of the third dot is red, and the display color of the fourth dot is cyan.

3. The liquid crystal display device according to claim 1, wherein the display color of one of the first dot and the second dot is green and that of the other dot is red, the display color of the third dot is blue, and the display color of the fourth dot is yellow.

4. The liquid crystal display device according to claim 1, wherein the first to fourth dots include:

first to fourth wavelength selecting elements having first to fourth peak wavelengths, respectively, in the wavelength characteristics; and a transmitted light amount controlling unit for controlling the amount of light transmitted through the wavelength selecting elements.

5. The liquid crystal display device according to claim 4, further comprising an illumination unit for illuminating the wavelength selecting elements with white light.

6. The liquid crystal display device according to claim 4, further comprising a reflecting portion for illuminating the wavelength selecting elements with reflected external light.

7. A color filter comprising:

a plurality of dots in a unit pixel, the dots of the unit pixel being arranged in a line, the dots including:

first to third dots respectively having first to third peak wavelengths in wavelength selection characteristics, and a fourth dot having a fourth peak wavelength which is located between the first peak wavelength and the second peak wavelength, the fourth peak wavelength being closer to the second peak wavelength than to the first peak wavelength in the wavelength selection characteristics, wherein the fourth dot is arranged not to be adjacent to the second dot, but is arranged to be adjacent to the first dot or the third dot.

8. The color filter according to claim 7, wherein first to fourth dots each display a different color when white light is transmitted therethrough, and the display color of one of the first dot and the second dot is blue and that of the other dot is green, the display color of the third dot is red, and the display color of the fourth dot is cyan.

9. The color filter according to claim 7, wherein the first to fourth dots each display a different color when white light is transmitted therethrough, and the display color of one of the first dot and the second dot is green and that of the other dot is red, the display color of the third dot is blue, and the display color of the fourth dot is yellow.

* * * * *